(12) United States Patent
Saito et al.

(10) Patent No.: US 8,503,501 B2
(45) Date of Patent: Aug. 6, 2013

(54) SPREAD SPECTRUM CLOCK GENERATION CIRCUIT AND A METHOD OF CONTROLLING THEREOF

(75) Inventors: Syuichi Saito, Kasugai (JP); Koji Okada, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 848 days.

(21) Appl. No.: 11/131,244

(22) Filed: May 18, 2005

(65) Prior Publication Data
US 2006/0176932 A1 Aug. 10, 2006

(30) Foreign Application Priority Data
Feb. 7, 2005 (JP) ................................ 2005-030917

(51) Int. Cl.
*H04B 1/69* (2006.01)
(52) U.S. Cl.
USPC ............................ 375/130; 375/373; 375/374
(58) Field of Classification Search
USPC .......................................... 375/130, 373, 374
See application file for complete search history.

(56) References Cited

U.S. PATENT DOCUMENTS

| | | | |
|---|---|---|---|
| 5,150,324 A * | 9/1992 | Takasuka et al. | 708/801 |
| 5,867,524 A * | 2/1999 | Booth et al. | 375/130 |
| 5,943,382 A * | 8/1999 | Li et al. | 375/376 |
| 6,046,646 A | 4/2000 | Lo et al. | |
| 6,377,646 B1 * | 4/2002 | Sha | 375/376 |
| 6,608,520 B1 * | 8/2003 | Miyazaki | 327/540 |
| 6,658,043 B2 * | 12/2003 | Hardin et al. | 375/130 |
| 6,980,581 B1 * | 12/2005 | Sha et al. | 375/130 |
| 2001/0013769 A1 * | 8/2001 | Saito | 323/282 |
| 2002/0171457 A1 | 11/2002 | Fujiwara | |
| 2003/0174005 A1 * | 9/2003 | Latham et al. | 327/172 |
| 2004/0136440 A1 | 7/2004 | Miyata et al. | |

FOREIGN PATENT DOCUMENTS

| | | |
|---|---|---|
| EP | 1 435 694 A2 | 7/2004 |
| JP | 2000-36741 A | 2/2000 |
| JP | 2000-101424 A | 4/2000 |
| JP | 2004-207846 A | 7/2004 |
| JP | 2004-208037 A | 7/2004 |
| JP | 2004-328280 A | 11/2004 |
| JP | 2004-328280 A | 11/2004 |

OTHER PUBLICATIONS

OA from Taiwan Pat. Office citing US2004/0136440.
"Japanese Office Action", English-Language Translation, mailed Aug. 25, 2009 from JP Patent Office for corresponding JP App. No. 2005-030917.

* cited by examiner

*Primary Examiner* — Shuwang Liu
*Assistant Examiner* — Michael Neff
(74) *Attorney, Agent, or Firm* — Fujitsu Patent Center

(57) ABSTRACT

A spread spectrum clock generation circuit and a controlling method thereof are disclosed, which provide clocks having less jitter and ideal spread spectrum and enable a reduction in circuit scale and in power consumption. To this end, a current control type modulator 19a is equipped with a current source Ia (current 4i). A charger unit CGa and a discharger unit DGa are designed such that currents i, 2i and 4i are allowed to flow, for example, by properly setting the sizes of transistors. Modulation cycles CIa to CIIIa are repeated and an output code is generated from a switching control circuit 20a according to each modulation cycle. A switching unit SSa is controlled according to the output code, thereby charging or discharging a capacitor element C1 with a charge/discharge current CDI corresponding to the output code. Hence, charge amounts and discharge amounts for all the modulation cycles CIa to CIIIa have the same value, i.e., 6i [A·clock].

14 Claims, 15 Drawing Sheets

A DIAGRAM SHOWING A SSCG CIRCUIT 10 IN A FIRST EMBODIMENT

FIG.1 A DIAGRAM SHOWING A SSCG CIRCUIT 10 IN A FIRST EMBODIMENT

A DIAGRAM SHOWING A PRACTICAL STRUCTURAL DIAGRAM OF A CURRENT CONTROL TYPE MODULATOR 19 IN FIRST EMBODIMENT

A DIAGRAM SHOWING A WAVEFORM CHART SHOWING THE OPERATION WAVEFORM OF THE CURRENT CONTROL TYPE MODULATOR 19 AND AN OUTPUT SIGNAL CK

FIG.4 A SPECTRUM WAVEFORM CHART OF THE OUTPUT SIGNAL CK FROM THE SSCG CIRCUIT 10

FIG.5 A CIRCUIT DIAGRAM OF A CURRENT CONTROL TYPE MODULATOR 19A IN A SECOND EMBODIMENT

WAVEFORMCHART OF THE OPERATION WAVEFORM OF THE CURRENT CONTROL TYPE MODULATOR 19a AND AN OUTPUT SIGNAL CK

FIG.8

A TABLE SHOWING THE CORRELATION BETWEEN AN OUTPUT CODE AND CURRENT VALUES

| MODULATION CYCLE | MC I | MC II | MC III | MC IV | MC V | MC VI | MC VII |
|---|---|---|---|---|---|---|---|
| CHARGE / DISCHARGE CURRENT (A) | 7i | 6i | 5i | 4i | 3i | 2i | 1i |
| FREQUENCY (S) | T0 | $\frac{7}{6}$T0 | $\frac{7}{5}$T0 | $\frac{7}{4}$T0 | $\frac{7}{3}$T0 | $\frac{7}{2}$T0 | 7T0 |
| DP2<br>DN2 | ON→OFF<br>OFF→ON | ON→OFF<br>OFF→ON | ON→OFF<br>OFF→ON | — | — | — | — |
| DP1<br>DN1 | ON→OFF<br>OFF→ON | ON→OFF<br>OFF→ON | — | — | ON→OFF<br>OFF→ON | ON→OFF<br>OFF→ON | — |
| DP0<br>DN0 | ON→OFF<br>OFF→ON | — | ON→OFF<br>OFF→ON | — | ON→OFF<br>OFF→ON | — | ON→OFF<br>OFF→ON |

A DIAGRAM SHOWING THE CONFIGURATION OF A CONVENTIONAL SSCG CIRCUIT 200

FIG.10 DIAGRAM SHOWING THE CIRCUIT CONFIGURATION OF A CONVENTIONAL SWITCHING CONTROL CIRCUIT 120 AND ANALOG MODULATOR 119

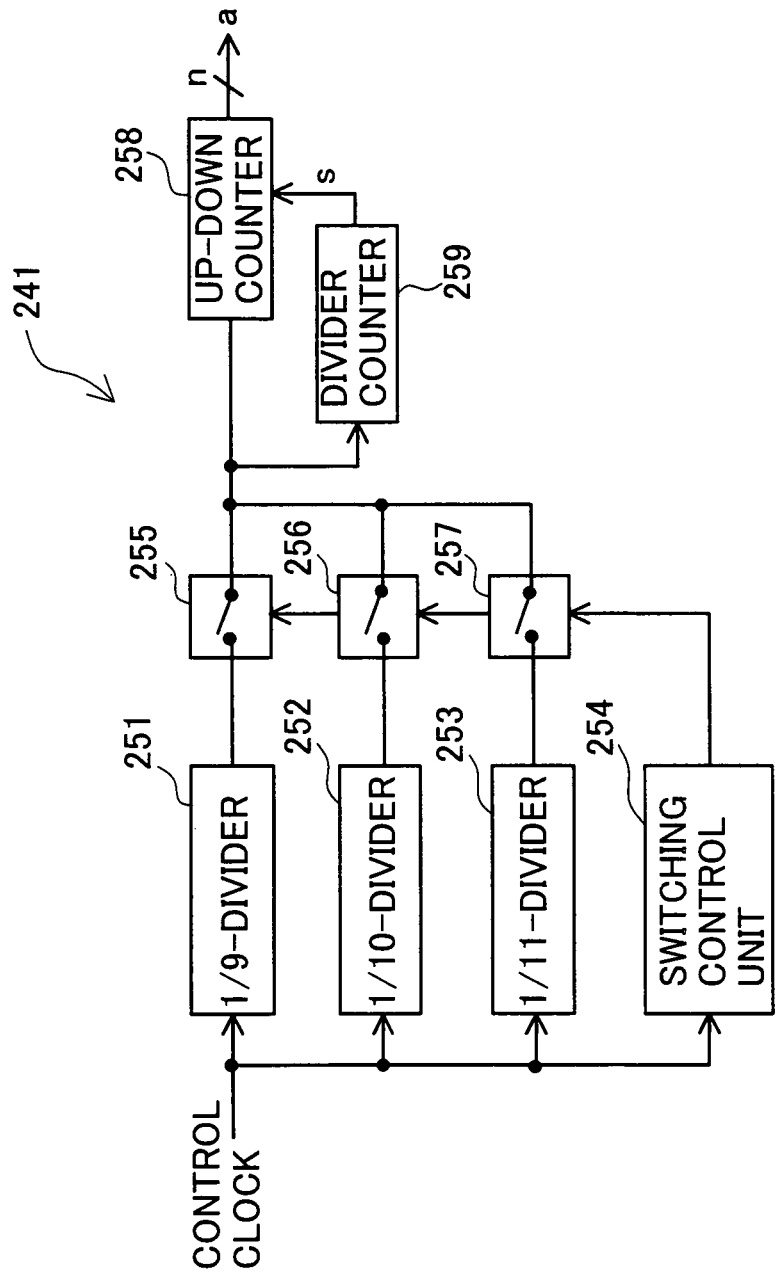
FIG.12 DIAGRAM SHOWING THE CONFIGURATION OF A CONVENTIONAL CONTROL UNIT 241

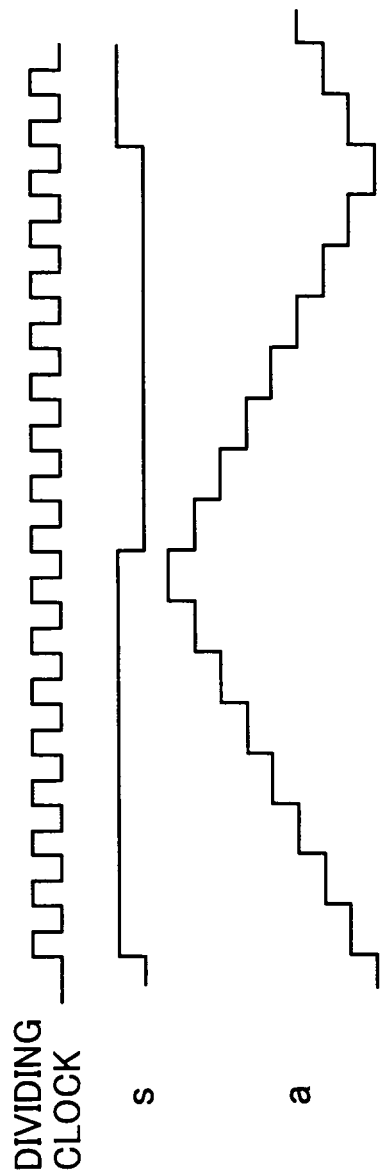
FIG.13 DIAGRAM SHOWING THE OPERATION OF AN UP-DOWN COUNTER 258 AND DIVIDER COUNTER 259

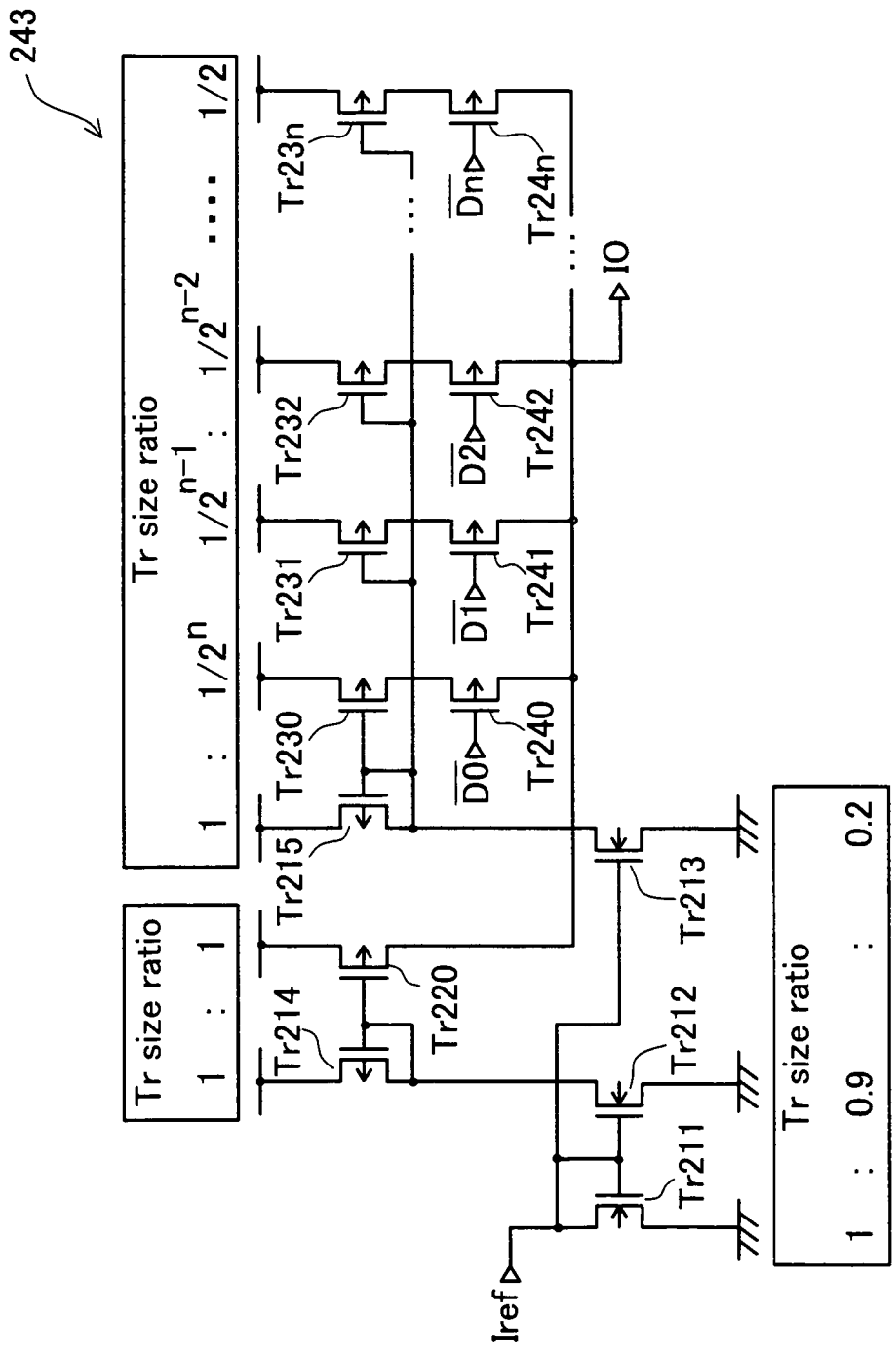
FIG.14 DIAGRAM SHOWING THE CIRCUIT CONFIGURATION OF A CONVENTIONAL DIGITAL-ANALOG CONVERTER 243

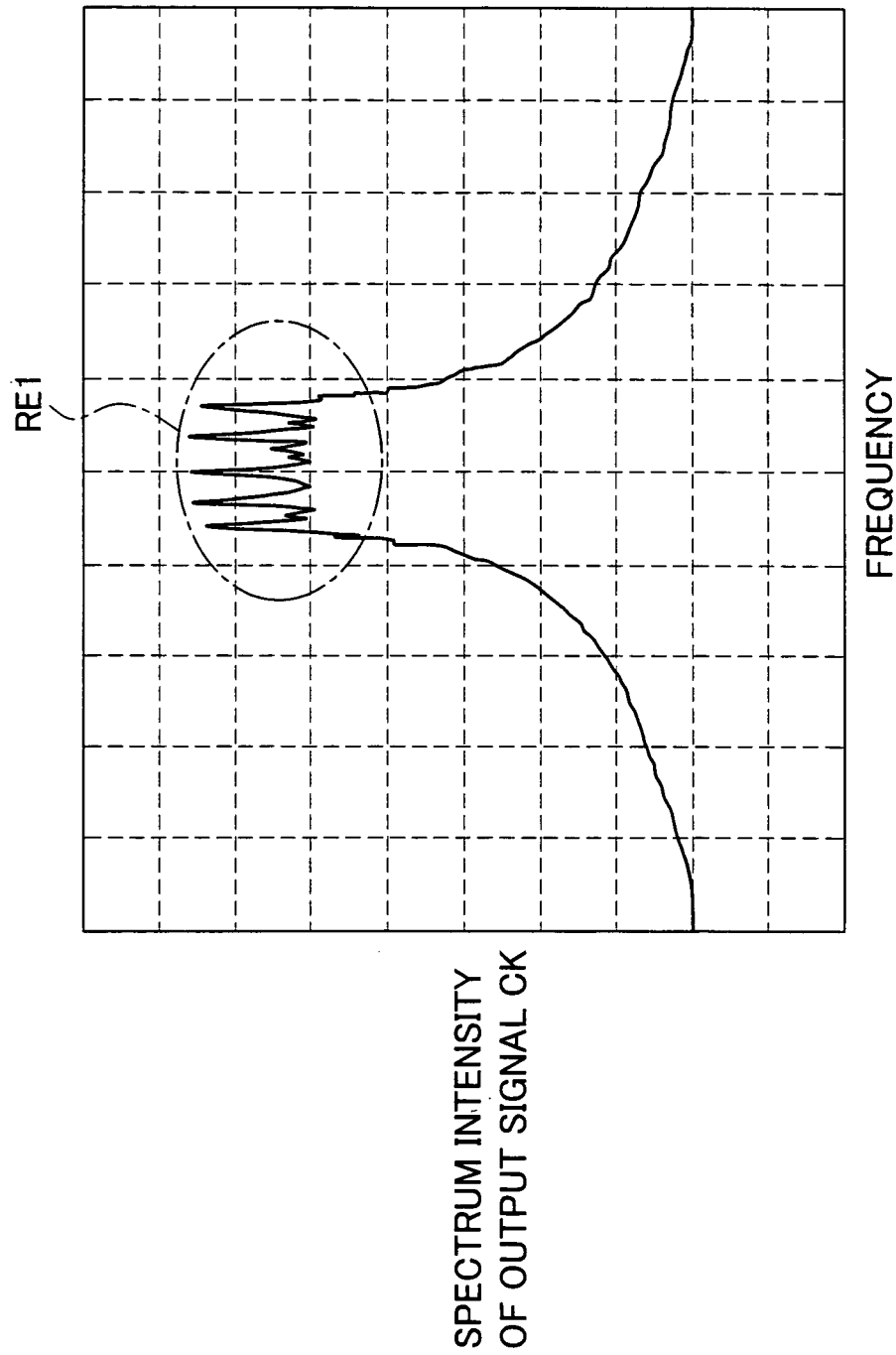
FIG.15 A SPECTRUM WAVEFORM CHART OF THE CONVENTIONAL SSCG CIRCUIT 200

SPREAD SPECTRUM CLOCK GENERATION CIRCUIT AND A METHOD OF CONTROLLING THEREOF

CROSS-REFERENCE TO RELATED APPLICATIONS

This application is based upon and claims the benefit of priority from each of the prior Japanese Patent Application No. 2005-030917 filed on Feb. 7, 2005, the entire contents of which are incorporated herein by reference.

BACKGROUND OF THE INVENTION

1. Field of the Invention

The present invention relates to a spread spectrum clock generation circuit which generates clock signals having a minutely varying cycle to reduce electromagnetic interference emission and a method of controlling the spread spectrum clock generation circuit.

2. Description of Related Art

FIG. 9 shows the configuration of the spread spectrum clock generation circuit (hereinafter referred to as "SSCG circuit") 200 disclosed in Japanese Unexamined Patent Publication No. 2004-207846. An analog modulator 119 generates a modulation signal VF according to control performed by a switching control circuit 120. The modulation signal VF is added to a control signal VLF in a voltage adder circuit 116. Then, the voltage adder circuit 116 outputs a control signal VIN.

FIG. 10 illustrates the circuit configuration of the switching control circuit 120 and the analog modulator 119 which are shown in FIG. 9. As shown in FIG. 10, the analog modulator 119 includes three capacitor elements C101 to C103 having different capacitance values. Herein, the capacitance values of these capacitor elements are set so as to satisfy C101<C102<C103. The capacitor elements are grounded at one end and connected, at the other end, to selector switches SW101 to SW103 respectively so that they are connected to one another through the switches. Switching of each switch between conductive/non-conductive states is controlled by the switching control circuit 120. A charger/discharger unit 104 is a current source circuit in which a current mirror circuit charges or discharges a common terminal connected to the switches SW101 to SW103, by supplying or getting rid of a current equal to a current i flowing in a constant current circuit. The common terminal to which the switches SW101 to SW103 are connected is an output terminal for an analog modulator. This terminal is connected to a hysteresis comparator 134 provided for a voltage fluctuation range detector 105. The hysteresis comparator 134 compares an input voltage of the common terminal for the switches SW101 to SW103 with first and second reference values; controls transistors Tr101 and Tr102 of the current source circuit according to the result of the comparison; and switches the current source circuit from its conductive state to its non-conductive state or vice versa.

Herein, the voltage of the control signal VIN is allowed to minutely fluctuate up and down thereby causing slight variations in the frequency of an output signal CK. The analog modulator 119 shown in FIG. 10 makes the voltage of the modulation signal VF vary minutely, thereby causing the control signal VIN to vary minutely through the voltage adder circuit 116.

Expediently, the state where PLL is locked is herein called "the initial state". In this state, the output signal CK has a frequency that is obtained by multiplying the frequency of a basic clock signal CLK by M/N. If a current is supplied to VF from the charger/discharger unit in this condition, the voltage of the modulation signal VF rises and the voltage of the control signal VIN rises through the voltage adder circuit 116 so that the frequency of the output signal CK slightly increases. When the voltage of the modulation signal VF reaches a certain value, a detection signal DS output from the voltage fluctuation range detector 105 becomes "H (high level)" so that the transistor Tr102 becomes electrically conductive and therefore the charge/discharge unit 104 starts discharging. Thereby, the voltage of the modulation signal VF starts to drop with a gradual decrease in the frequency of the output signal CK. At the time when the voltage of the modulation signal VF reaches a certain value after further decreasing, the detection signal DS becomes "L (low level)" and the transistor Tr101 becomes conductive, so that the charger/discharger unit 104 starts charging. This operation is repeated whereby the frequency of the output signal CK minutely varies. The capacitor elements C101 to C103 are switched by the switching control circuit 120 to change capacitance, so that combined modulation can be carried out to vary the minutely varying cycle (i.e., modulation cycle) of the frequency, which enables a reduction in electromagnetic interference emission.

FIG. 11 shows an SSCG circuit 200a according to the second configuration example of Japanese Unexamined Patent Publication No. 2004-207846. The SSCG circuit 200a shown in FIG. 11 differs from the first SSCG circuit 200 in that the former includes a voltage-current conversion (V-I conversion) circuit 242, a current digital-analog converter (IDAC) 243, a current control oscillator (ICO) 244 and a control circuit 241. The voltage-current conversion circuit 242 converts the terminal voltage (differential voltage) of a loop filter 214 into a differential current signal Iref. The current digital-analog converter 243, which is equivalent to a variable current circuit, performs spread spectrum modulation of the differential current signal Iref according to an output code from the control circuit 241 and releases a modulated spread spectrum modulation current signal IO to the current control oscillator (ICO) 244.

FIG. 12 shows a configuration of the control circuit 241. The control circuit 241 includes (i) three dividers 251 to 253 for dividing a control clock at different dividing ratios (herein, 1/9, 1/10 and 1/11 are employed); (ii) switches 255 to 257 for selecting an output of any of the dividers; (iii) a switching control unit 254 for selecting any of the switches; (iv) an up-down counter 258 for counting selected divided clocks; and (v) a divider counter for controlling the up-down counter 258. The up-down counter 258 outputs a binary-coded counter value having n bits.

FIG. 13 shows the operations of the up-down counter 258 and the divider counter 259. The up-down counter 258 counts selected divided clocks and outputs a count value in n-bit, binary-coded form. The code output from the up-down counter 258 is applied to the digital-analog converter 243.

As shown in FIG. 14, the digital-analog converter 243 has a current mirror circuit comprised of transistors Tr211 to Tr215, Tr220, Tr230 to Tr23n, and the sizes of the transistors are appropriately set as shown in the figure. Accordingly, a proper amount of current ranging from 90% to about 110% of the differential current signal Iref is output as the spread spectrum modulation current signal IO, by setting the bit data /D0 to /Dn of the output code to proper values.

Techniques related to the above-described method are disclosed in Japanese Unexamined Patent Publication Nos. 2000-101424 and 2000-36741.

SUMMARY OF THE INVENTION

In the known art shown in FIG. 10, it is necessary to change the capacitor to be connected to the modulation signal VF when combined modulation is carried out, and if there is a difference between the modulation signal VF and the voltage of the selected capacitor at the time of switching, the voltage level of the modulation signal VF discontinuously varies before and after the switching. At that time, the frequency of the output signal CK excessively varies before and after the switching of the capacitor, which sometimes increases undesirable jitter.

In the prior art shown in FIG. 11, the control circuit 241 needs to include the up-down counter 258, the divider counter 259, etc. as shown in FIG. 12. This disadvantageously causes an increase in circuit scale.

In FIG. 11, the control of the output signal CK is carried out by use of the current control oscillator 244. Since this control is current control, power is consumed at all times in the current digital-analog converter 243 and therefore power saving cannot be expected.

The invention is directed to overcoming at least one of the problems described in "Background of the Invention", and a primary object of the invention is therefore to provide a spread spectrum clock generation circuit and a method of controlling a spread spectrum clock generation circuit, which ensure clock generation accompanied with less jitter and ideal spread spectrum and enable use of a small-scale circuit and, in consequence, lower power consumption.

To achieve the above object, according to one aspect of the invention, there is provided a spread spectrum clock generation circuit comprising: a voltage control oscillator circuit; a voltage adder for adding a voltage for controlling the frequency of an output signal from the voltage control oscillator circuit so as to have a specified value to a voltage for modulating the frequency of the output signal of the voltage control oscillator circuit and outputting the sum of said voltages to the voltage control oscillator circuit; a capacitor unit for outputting said voltage for modulating the frequency to the voltage adder; a first charger unit for charging the capacitor unit; a second charger unit for discharging the capacitor unit; and a switching unit for alternatively making a connection between the first charger unit and the capacitor unit or between the second charger unit and the capacitor unit in each of a plurality of different cycles to which a modulation cycle varies.

The voltage adder adds a voltage for controlling the frequency of an output signal from the voltage control oscillator circuit so as to have a specified value to a voltage for modulating the frequency of the output signal of the voltage control oscillator circuit and, then, outputs the sum of these voltages to the voltage control oscillator circuit. The voltage control oscillator circuit outputs an output signal having frequency corresponding to an input signal. The first charger unit charges the capacitor unit. The second charger unit discharges the capacitor unit. The switching unit alternatively makes a connection between the first charger and the capacitor unit or between the second charger and the capacitor unit in the modulation cycle which varies to a plurality of different cycles. The capacitor unit performs current-voltage conversion, and then, outputs a voltage to the voltage adder, for modulating the frequency after the conversion.

The capacitor unit is charged by establishing a connection between the first charger unit and the capacitor unit with the switching unit. As the capacitor unit is charged, the voltage for modulating the frequency of the output signal rises. The capacitor unit is discharged by establishing a connection between the second charger unit and the capacitor unit with the switching unit. As the capacitor unit is discharged, the voltage for modulating the frequency of the output signal drops. The voltage for controlling the frequency of the output signal of the voltage control oscillator circuit so as to have a specified value and the voltage for modulating the frequency of the output signal of the voltage control oscillator circuit are added together to be input to the voltage control oscillator circuit. As a result, the frequency of the output signal of the voltage control oscillator circuit goes up and down in correspondence with up and down fluctuation in the voltage for modulating frequency. Further, the modulation cycle varies to a plurality of different cycles during this time, whereby the combined modulation is carried out.

To achieve the above object, according to another aspect of the invention, there is provided a method of controlling a spread spectrum clock generation circuit, comprising the steps of: alternatively charging or discharging a capacitor unit in each of a plurality of different cycles to which a modulation cycle is varied; outputting a voltage value according to the amount of charge accumulated in the capacitor unit; and outputting a signal indicative of oscillation frequency modulated according to a voltage value corresponding to said amount of charge.

The step of alternatively charging or discharging the capacitor unit is performed in each of the plurality of cycles to which the modulation cycle is varied. Hence, the combined modulation is carried out. By the step of outputting a voltage value according to the amount of electric charge accumulated in the capacitor unit, current-voltage conversion is carried out. In correspondence with changes in the voltage value of the capacitor unit, the oscillation frequency of the output signal is modulated. Thus, spread spectrum clock generation is performed.

With the above arrangement, the invention provides the following effects. First of all, according to the invention, the control of the voltage (hereinafter referred to as "modulation voltage") for modulating the frequency of the output signal of the voltage control oscillator circuit is carried out by controlling a charge/discharge current for the capacitor unit. More specifically, the capacitor unit is charged or discharged and outputs a modulation voltage obtained by current-voltage conversion. Since the voltage level of the modulation voltage output from the capacitor unit continuously varies in accordance with the amount of charge in the capacitor unit, the voltage level smoothly changes without causing abrupt discontinuous changes at the points of switching between a charge phase and a discharge phase. As a result, clocks accompanied with less jitter and ideal spread spectrum become possible, which highly contributes to a reduction in electromagnetic interference emission.

Secondly, in the invention, the control of the signal for modulating the frequency of the output signal is performed with current, whereas a voltage control oscillator circuit is used as the oscillator circuit. In this arrangement, current-voltage conversion is carried out in the capacitor unit. Thus, the use of the voltage control oscillator circuit reduces current consumption, compared to cases where a current control oscillator is used, so that power saving can be achieved.

Thirdly, the invention is designed to switch the current path with the switching unit. This makes it possible to employ circuit configuration simpler than the conventional complicated circuit configurations which involve a divider, up-down counter, divider counter, switching circuit and others. The circuit according to the invention employs a less number of capacitors, thereby reducing circuit space occupied by the capacitors which generally require a large space, in contrast with the prior cases employing a plurality of capacitors. This enables a reduction in circuit scale. In addition, use of a small-scale circuit leads to power saving.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 8 is a table showing the correlation between an output code and current values;

FIG. 12 shows the configuration of a conventional control unit 241;

FIG. 13 shows the operation of an up-down counter 258 and divider counter 259;

FIG. 14 shows the circuit configuration of a conventional digital-analog converter 243; and FIG. 15 is a spectrum waveform chart of the conventional SSCG circuit 200.

DETAILED DESCRIPTION OF THE PREFERRED EMBODIMENTS

Referring now to the accompanying drawings and, more particularly, to FIGS. 1 to 9, a spread spectrum clock generation circuit and a method of controlling a spread spectrum clock generation circuit will be hereinafter described in detail according to preferred embodiments. A first embodiment of the invention will be described with reference to FIGS. 1 to 4.

Figure 1:
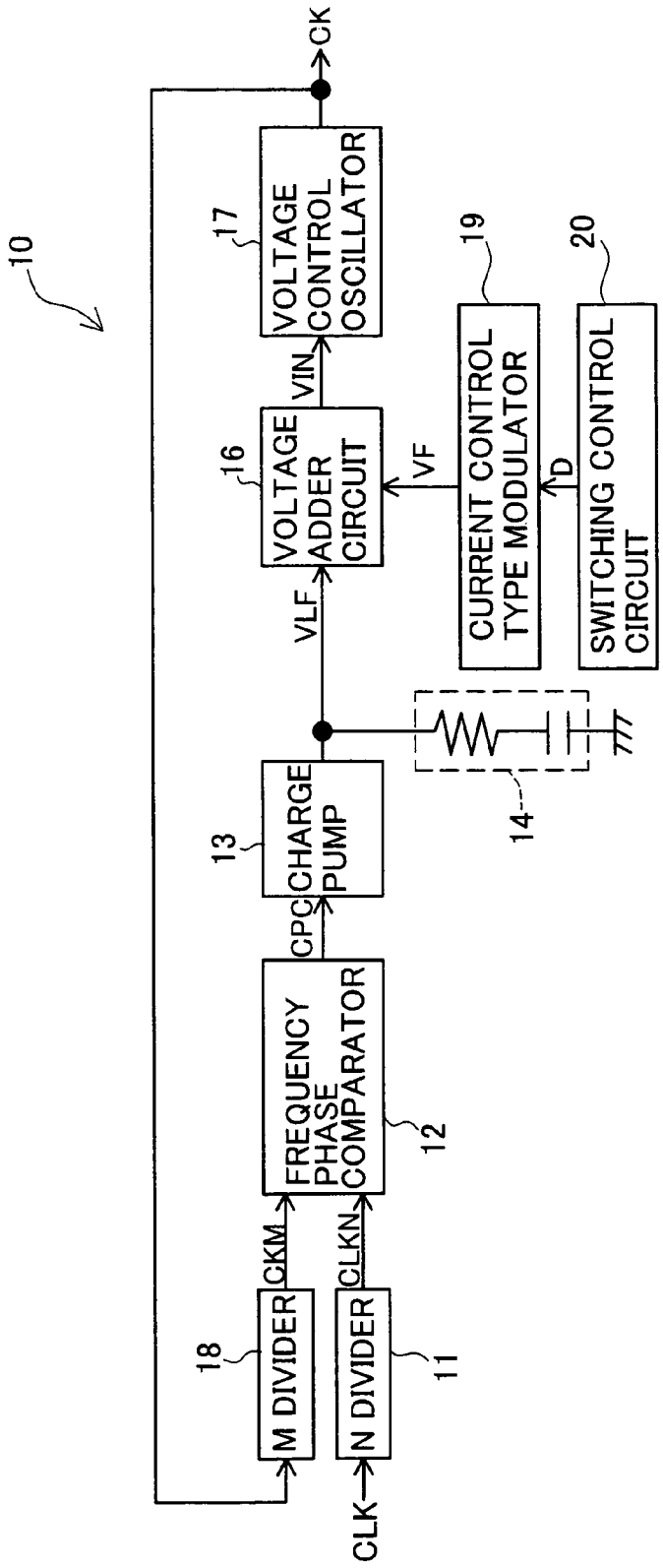
FIG. 1 shows an SSCG circuit 10 according to a first embodiment.

FIG. 1 shows an SSCG circuit 10 which is constructed based on a PLL circuit configuration. The SSCG circuit 10 includes an N divider 11, a frequency phase comparator 12, a charge pump 13, a loop filter 14, a voltage adder circuit 16, a voltage control oscillator 17, an M divider 18, a current control type modulator 19 and a switching control circuit 20.

The N divider 11 outputs a signal CLKN obtained by dividing a basic clock signal CLK. The M divider 18 outputs a signal CKM obtained by dividing an output signal CK. The frequency phase comparator 12 detects the phase difference between the signals CLKN and CKM to output a control signal CPC according to the phase difference.

In response to the control signal CPC, a charge pump CP functions to increase the voltage of a control signal VLF, if the phase of the divider signal CKM is behind the divider signal CLKN. Therefore, the voltage of a control signal VIN is increased through the voltage adder circuit 16 and the oscillation frequency of the voltage control oscillator (VCO) 17 is increased, so that the phase delay of the divider signal CKM relative to the divider signal CLKM is controlled so as to decrease. This operation is repeated, whereby the phase difference between the divider signals CKM and CLKM is eventually substantially eliminated.

On the other hand, if the phase of the divider signal CKM is ahead of the divider signal CLKN, the charge pump (CP) 13 functions to reduce the voltage of the control signal VLF. This causes the voltage of the control signal VIN to decrease through the voltage adder circuit 16, lowering the oscillation frequency of the voltage control oscillator (VCO) 17, so that the phase lead of the divider signal CKM relative to the divider signal CLKM is reduced. This operation is repeated, whereby the phase difference between the divider signals CKM and CLKM is finally substantially eliminated. With the operation described above, the output signal CK is obtained as a clock by multiplying the basic clock signal CLK by M/N and output from the voltage control oscillator 17.

In the PLL circuit configuration described earlier, the frequency of the output signal CK can be allowed to minutely vary through the minute up and down fluctuations in the voltage of the control signal VIN, by adding a modulation signal VF output from the current control type modulator 19 to the control signal VLF.

Figure 2:
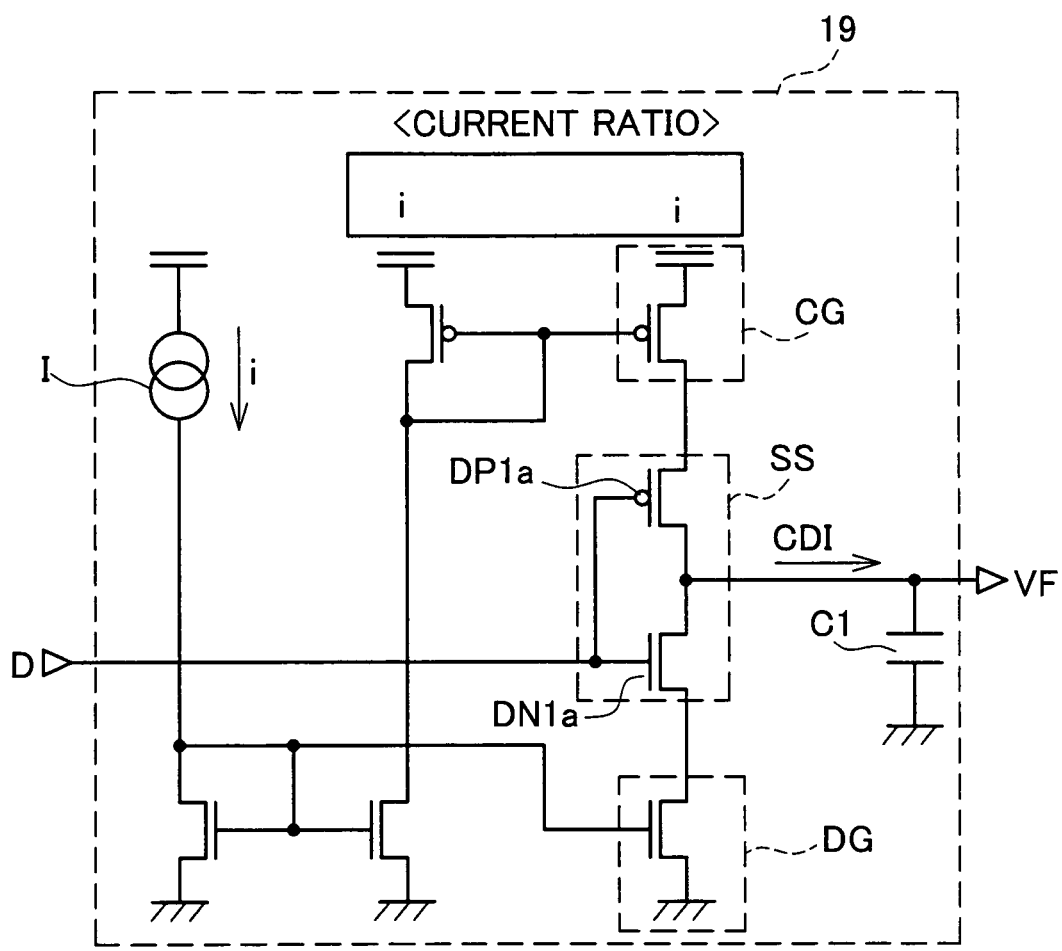
FIG. 2 is a practical structural diagram of a current control type modulator 19 according to the first embodiment.

FIG. 2 is a practical structural diagram of the current control type modulator 19 according to the first embodiment. The current control type modulator 19 of this embodiment is a current control type modulator and differs in configuration from the analog modulator 119 which is a capacitance control type modulator. The current control type modulator 19 is a current source circuit in which a current equal to the current i of a current source I is supplied to (i.e., electric charge) or discharged from (i.e., electric discharge) a terminal of a capacitor element C1. The current control type modulator 19 is equipped with the current source I (current i). The current control type modulator 19 further includes a charger unit CG and a discharger unit DG. The current supply capacity of the current unit CG is equal to that of the discharger unit DG and the current i flows in these units. The current control type modulator 19 further includes a switching unit SS and the capacitor element C1. The switching unit SS has transistors DP1a, DN1a. Input to the gates of these transistors is a switching signal D. The charger unit CG and the discharger unit DG charges and discharges the capacitor element C1, respectively, in response to the switching signal D. The capacitor element C1 performs current-voltage conversion and outputs a modulation signal VF.

Figure 3:
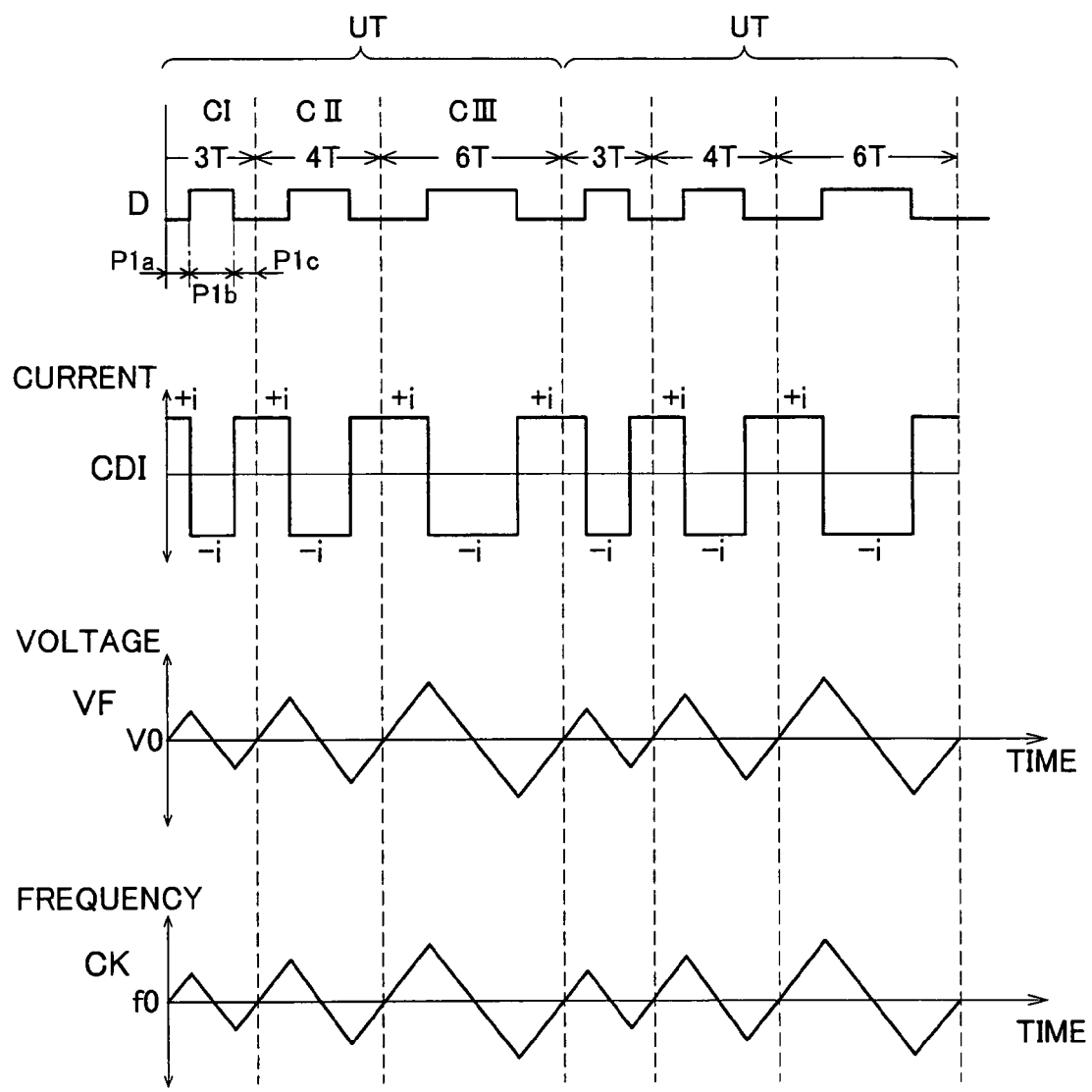
FIG. 3 is a waveform chart showing the operation waveform of the current control type modulator 19 and an output signal CK.

FIG. 3 is a waveform chart showing the operation waveform of the current control type modulator 19 and the output signal CK. The minimum cycle serving as a criterion herein is defined as "a basic cycle T". A cycle having a cycle length which is an integral multiple of the basic cycle T is defined as "a modulation cycle". In FIG. 3, the cycle having a cycle length three times the basic cycle T is referred to as "the modulation cycle CI". The cycles having a cycle length four times and six times the basic cycle T are "the modulation cycle CII" and "the modulation cycle III", respectively. The modulation cycles CI through CIII constitutes one unit cycle UT and this unit cycle UT is repeated.

The operation in the modulation cycle CI will be explained below. In period P1a (FIG. 3) from the starting point to ¼ point of the modulation cycle CI, the switching signal D is at low level, the transistor DP1a is in its conductive state, and the transistor DN1a is in its non-conductive state, so that the amount of charge/discharge current CDI supplied to the capacitor element C1 becomes +i (it should be noted that the direction of current for charging the capacitor element C1 is positive herein). The voltage of the modulation signal VF rises with a gradient corresponding to this current amount. As the voltage increases, the control signal VIN increases through the voltage adder circuit 16, so that the frequency of the output signal CK also increases.

In period P1b from the ¼ point to ¾ point of the modulation cycle CI, the switching signal D is at high level and the transistor DP1a is in its non-conductive state whereas the transistor DN1a is in its conductive state. Therefore, the amount of charge/discharge current CDI discharged from the capacitor element C1 becomes −i. The voltage of the modulation signal VF drops with a gradient corresponding to this current amount. With this dropping voltage, the control signal VIN decreases through the voltage adder circuit 16 so that the frequency of the output signal CK also decreases. Similarly, in period P1c from the ¾ point to termination point of the modulation cycle CI, the switching signal D is at low level. Thus, the capacitor element C1 is charged with the current amount +i, accompanied with an increase in the voltage of the modulation signal VF and an increase in the frequency of the output signal CK.

In the modulation cycle CI, a connection between the charger unit CG and the capacitor element C1 and a connection between the discharger unit DG and the capacitor element C1 are established at a time ratio of 1 to 1. The current supply capacity of the charger unit CG is equal to that of the discharger unit DG. Therefore, the amount of electric charge of the capacitor element C1 is equal to the amount of electric discharge of the capacitor element C1 in the modulation cycle CI. Accordingly, the voltage values of the modulation signal VF at the starting point and termination point of the modulation cycle CI are both equal to a basic voltage V0. In addition, the frequencies of the output signal CK at the starting point and termination point of the modulation cycle CI are both equal to a basic frequency f0.

The similar operation is thereafter repeated in the modulation cycles CII and CIII. In the modulation cycle CII, the charge amount and discharge amount of the capacitor element C1 are equal. In the modulation cycle CIII, the charge amount and discharge amount of the capacitor element C1 are equal. Therefore, the output signal CK has the same frequency (which is equal to the basic frequency f0) at the starting point and termination point of the modulation cycle CII. Also, the output signal CK has the same frequency (which is equal to the basic frequency f0) at the starting point and termination point of the modulation cycle CIII. Accordingly, the frequency of the output signal CK returns to the basic frequency f0 without fail at the termination point of each modulation cycle. Thanks to this, when the unit cycle UT is repeated, the average frequency of the output signal CK can be prevented from deviating from the basic frequency f0. Repetition of the unit cycle UT enables minute variations in the frequency of the output signal CK.

Figure 4:
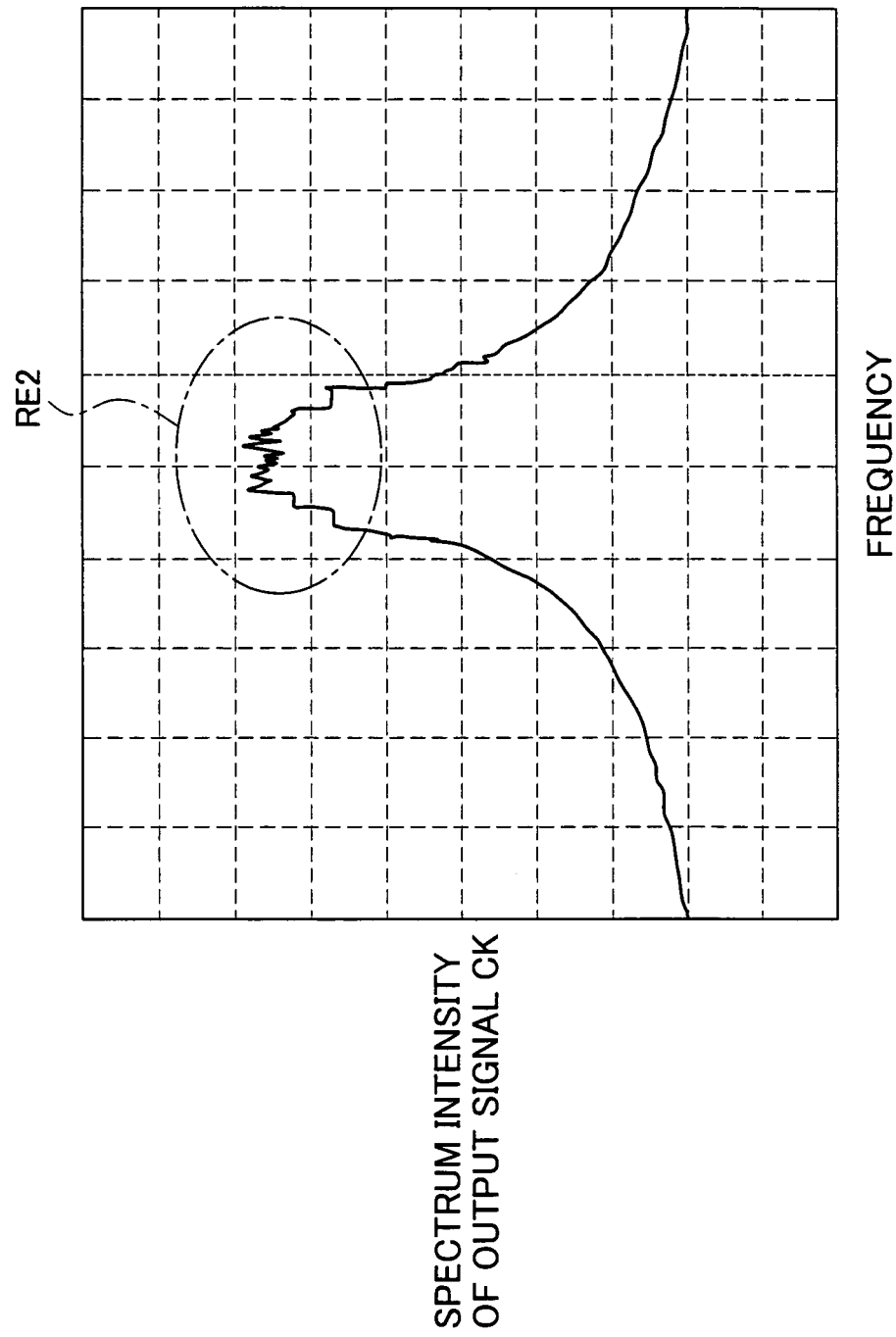
FIG. 4 is a spectrum waveform chart of the output signal CK from the SSCG circuit 10.
Figure 9:
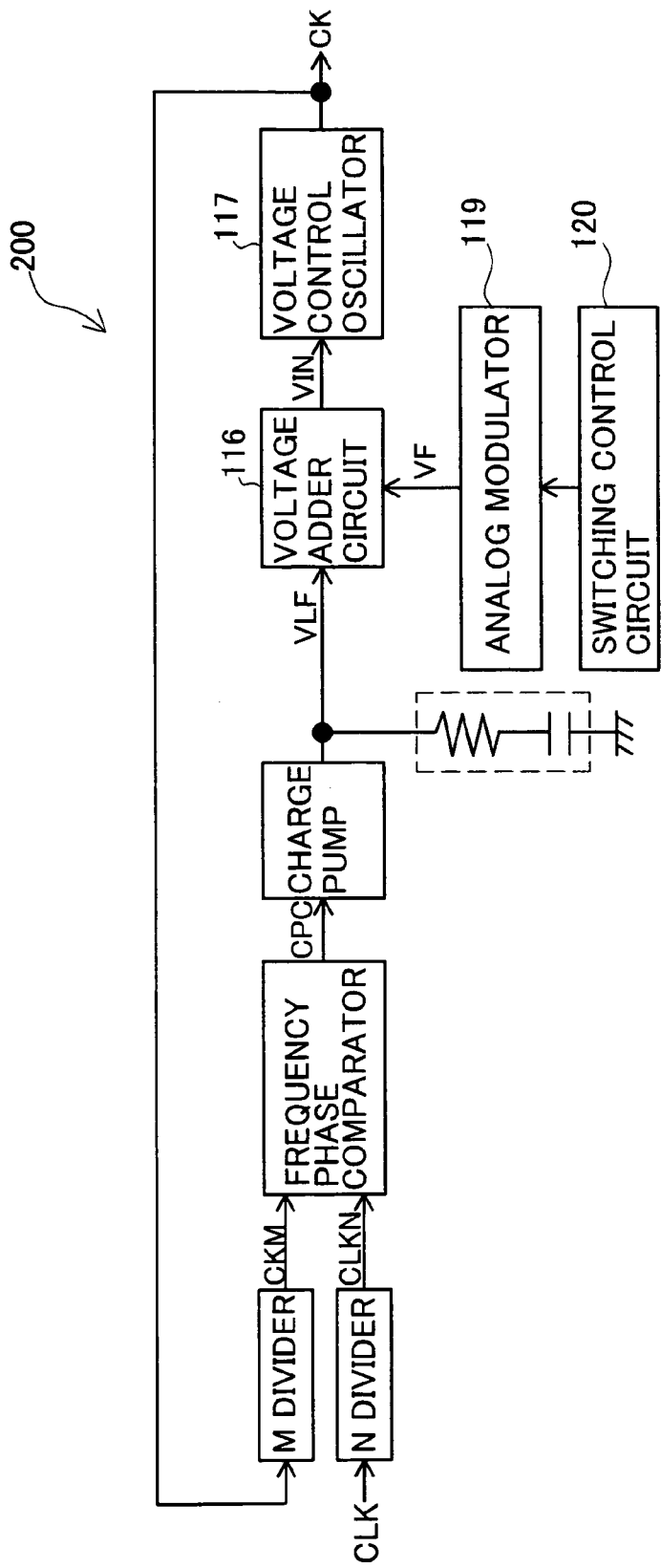
FIG. 9 shows the configuration of a conventional SSCG circuit 200.

Reference is made to the spectrum waveform charts of FIGS. 15 and 4 to describe the effect of the SSCG circuit 10 used in the first embodiment. FIG. 15 shows a spectrum waveform chart of the conventional SSCG circuit 200 (FIG. 9). In the SSCG circuit 200, since the analog modulator 119 is used, the frequency of the output signal CK excessively varies before and after switching capacitance, with the result that significant jitter occurs in the clocks. This jitter causes malfunctions in the circuit and electronic devices which operate in response to the output signal CK. In addition, it causes sharp peaks such as shown in region RE1 (FIG. 15). The generation of sharp peaks brings about an increase in electromagnetic interference emission and adverse effects such as malfunctions owing to a mutual interference between electronic devices and disturbance to communication apparatus.

FIG. 4 shows a spectrum waveform chart associated with the SSCG circuit 10 of the first embodiment. Since the SSCG circuit 10 uses a current control type modulator, the value of voltage can be continuously varied so that jitter in the clock of the output signal CK can be reduced and, in consequence, malfunctions in the circuit and electronic devices, which operate in response to the output signal CK, can be prevented. The continuous variations in voltage restrict occurrence of sharp peaks as shown in region RE2. Accordingly, the maximum value of spectrum intensity can be lowered compared to the case where the SSCG circuit 200 is used. As a result, electromagnetic interference emission can be reduced thereby preventing malfunctions or the like caused by a mutual interference between electronic devices.

As precisely described earlier, the SSCG circuit 10 of the first embodiment has the following three effects. Firstly, in the SSCG circuit 10, the control of the modulation signal VF is made by controlling charge/discharge current for the capacitor element C1. In the capacitor element C1, current-voltage conversion is effected to output the modulation signal VF which has been converted to voltage. Then, the voltage level of the modulation signal VF output from the capacitor element C1 continuously varies in correspondence with the charge amount of the capacitor element C1, so that a discontinuous abrupt change does not occur in the voltage level at the point of switching between charging and discharging and therefore the voltage level can be smoothly switched. Since clock generation with less jitter and spread spectrum having less sharp peaks such as shown in FIG. 4 are enabled, the effects of eliminating malfunctions in electronic devices and reducing electromagnetic interference emission can be achieved. Secondly, the capacitor element C1 effects current-voltage conversion in the SSCG circuit 10. This enables it to use not a current-control oscillator but a voltage-control oscillator. Where a current-control oscillator is used like the prior art, current is consumed throughout the period of one cycle. In contrast with this, the present embodiment carries out charge and discharge at a time ratio of 1:1. Thus, charge is performed only in a half of a cycle and therefore current consumption can be reduced. This leads to power saving.

Figure 10:
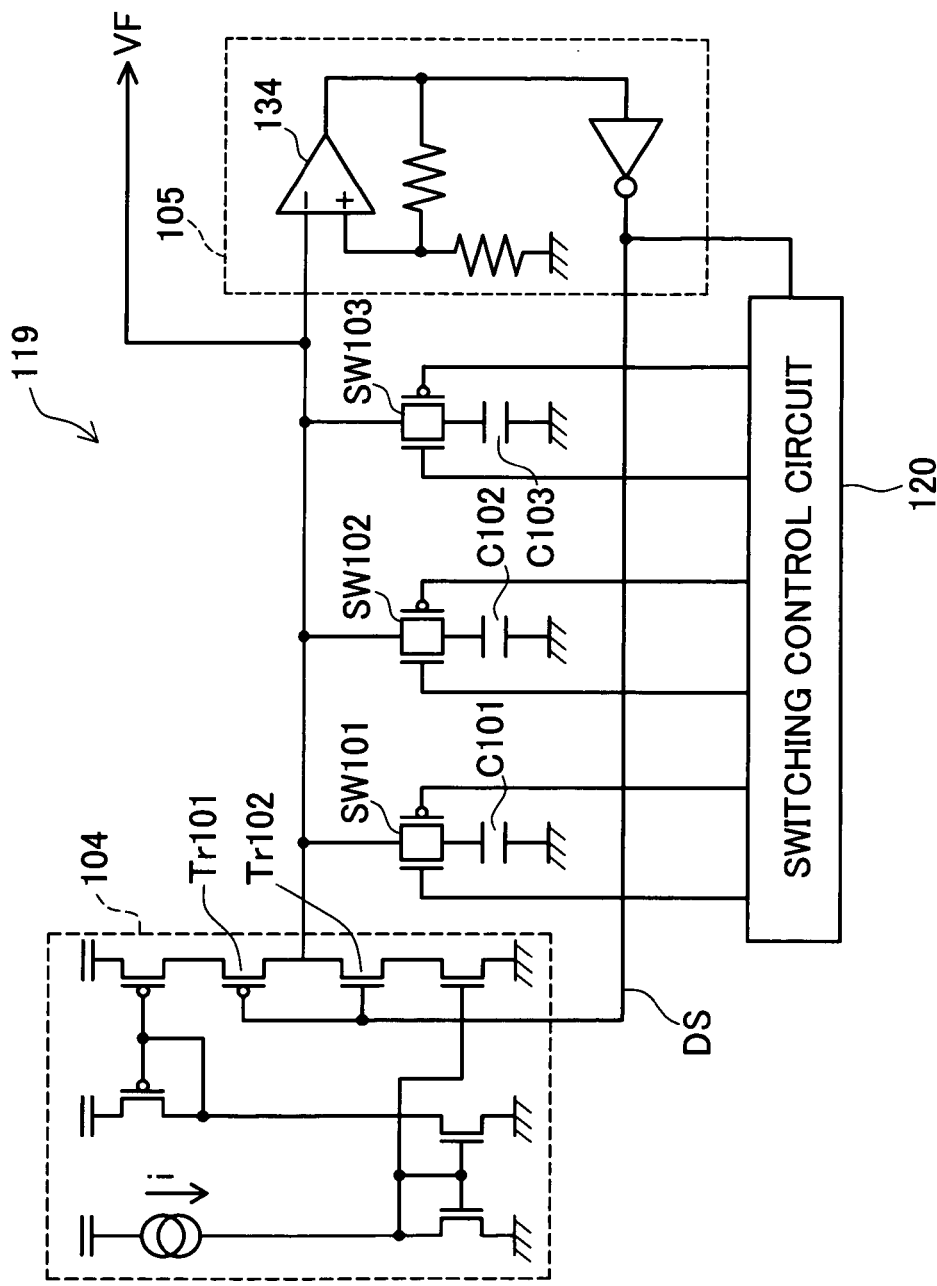
FIG. 10 shows the circuit configuration of a conventional switching control circuit 120 and analog modulator 119.
Figure 11:
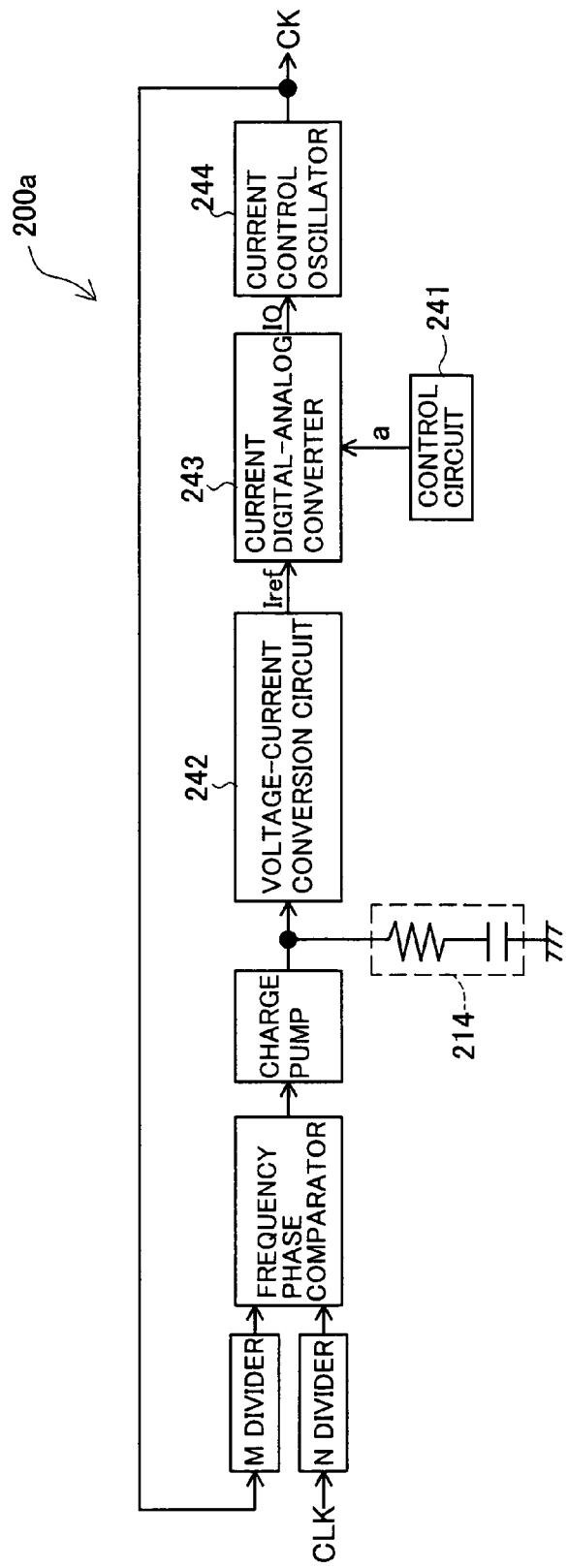
FIG. 11 shows an SSCG circuit 200a according to a second configuration example of the prior art.

Thirdly, the current control type modulator 19 (FIG. 2) of the invention is designed to switch the current path by the switching unit SS. Unlike the current digital-analog converter 243 (FIG. 12) of the prior art SSCG circuit 200a (FIG. 11), it does not need the dividers 251 to 253, the up-down counter 258, the divider counter 259, the switches 255 to 257 etc., so that simple circuit configuration can be ensured. In addition, unlike the analog modulator 119 (FIG. 10) of the prior art SSCG circuit 200 (FIG. 9), it does not need the capacitor elements C101 to C103 which require a large circuit space, the voltage fluctuation range detector 105, etc., so that simple circuit configuration can be obtained. This leads to a reduction in circuit scale and, therefore, power saving.

Reference is made to FIGS. 5 to 8 to describe a second embodiment of the invention. In the second embodiment, the SSCG circuit 10 (FIG. 1) uses a current control type modulator 19a in place of the current control type modulator 19. Also, the switching control circuit 20 is replaced with a switching control circuit 20a. The second embodiment employs the same PLL circuit configuration and operation as in the prior art, and therefore, a detailed description of them is skipped herein.

Output from the switching control circuit 20a are digital output codes (signals DP0, DP1, DP2, DN0, DN1, DN2) corresponding to the modulation cycles. The digital output codes are in turn input to the current control type modulator 19a.

Figure 5:
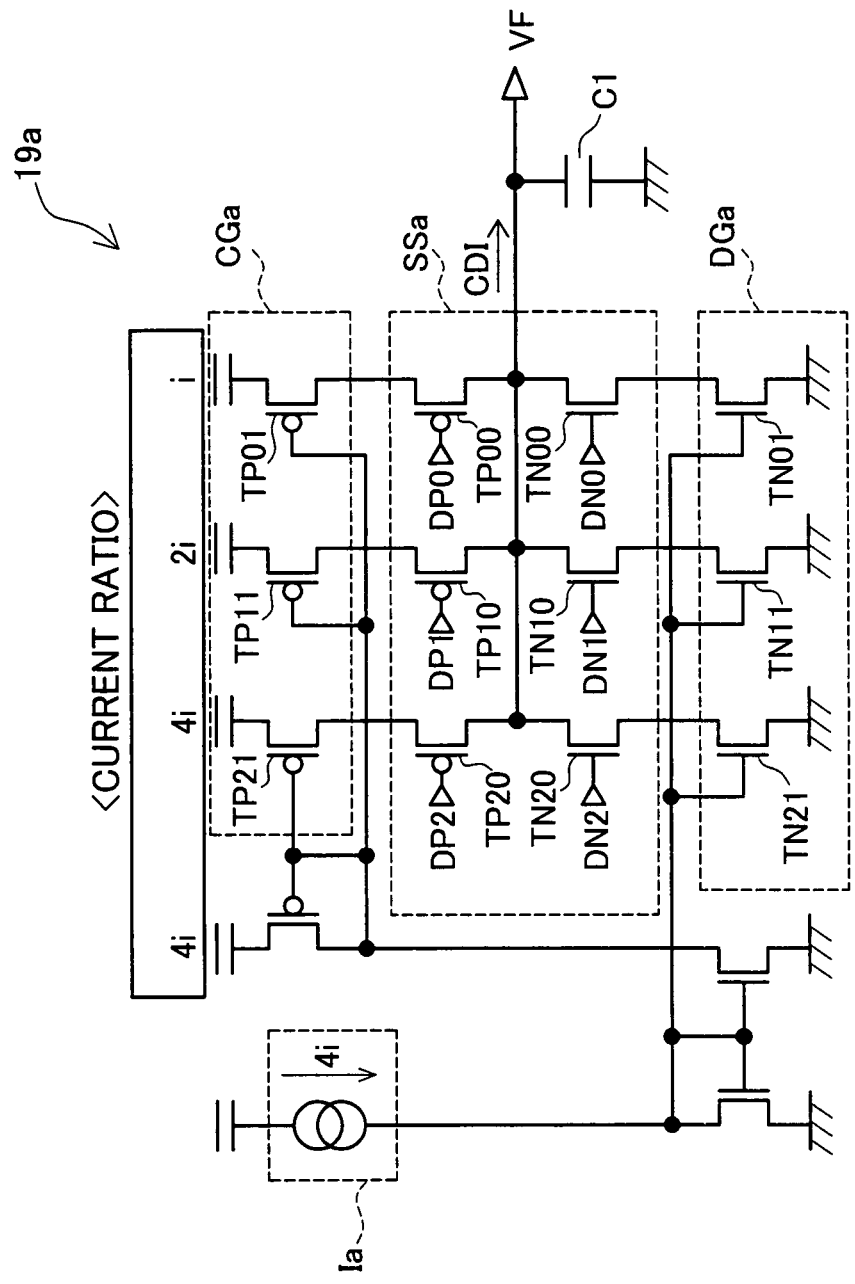
FIG. 5 is a circuit diagram of a current control type modulator 19a according to a second embodiment.

FIG. 5 shows a circuit diagram of the current control type modulator 19a. The current control type modulator 19a is equipped with a current source Ia (current 4i). The current control type modulator 19a further includes a charger unit CGa and a discharger unit DGa. The charger unit CGa is set so as to allow flows of currents i, 2i and 4i, for example, by properly setting the sizes of the transistors. Thereby, current supply capacity is weighted by the power of 2. The discharger unit DGa is so arranged as to correspond to the charger unit CGa. The discharger unit DGa has the same current supply capacity as the charger unit CGa and is designed to allow flows of currents i, 2i and 4i.

The current control type modulator 19a is equipped with a switching unit SSa. Transistors TP00, TN00, TP10, TN10, TP20, TN20 are provided for the switching unit SSa, and signals DP0, DN0, DP1, DN1, DP2, DN2 are input to their respective gates. The configuration of the current control type modulator 19a is the same as that of the current control type modulator 19 of the first embodiment except for the feature described above, and therefore a further explanation is omitted herein.

Figure 6:
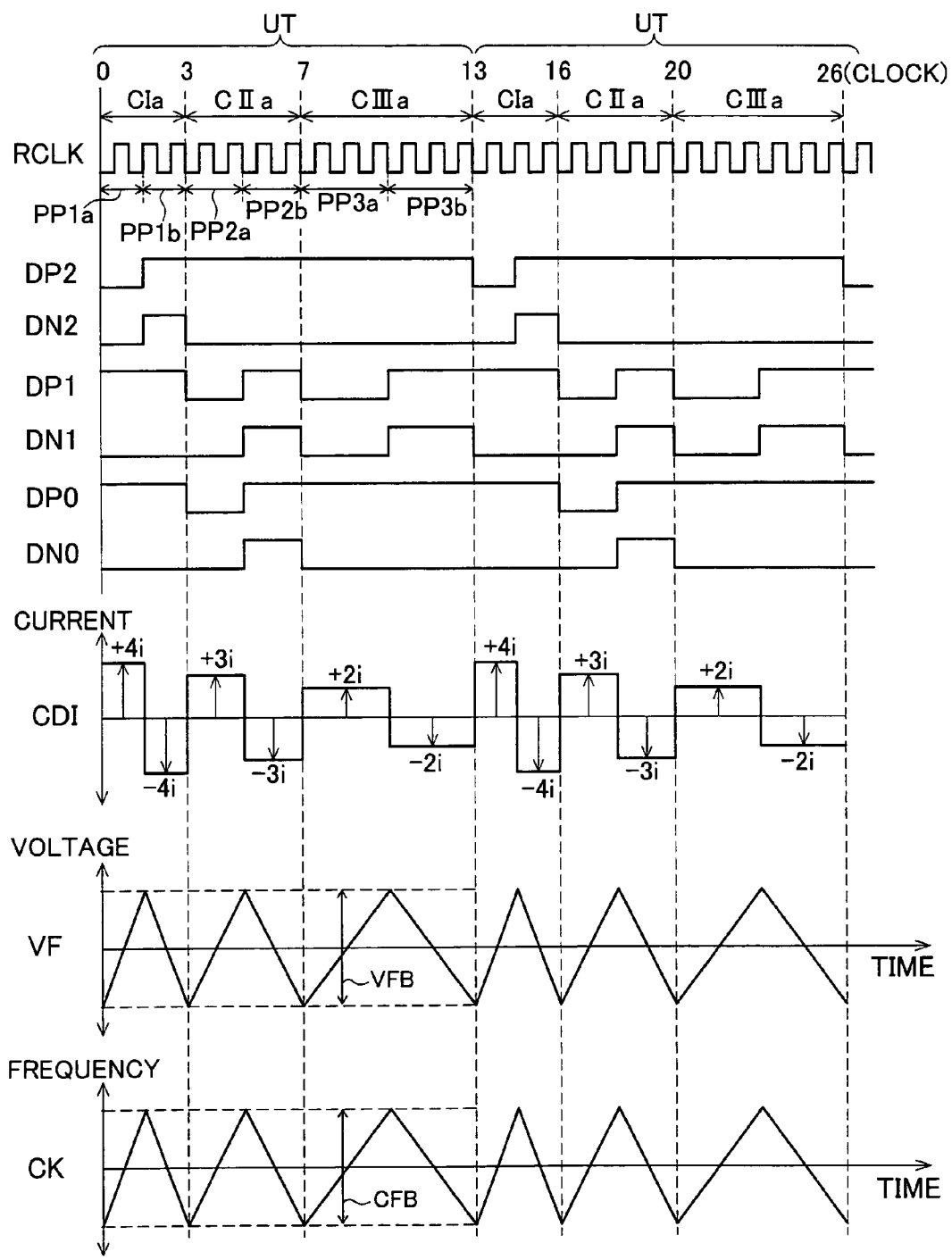
FIG. 6 is a waveform chart showing the operation waveform of the current control type modulator 19a and an output signal CK.

FIG. 6 is a waveform chart showing the operation waveform of the current control type modulator 19a and the output signal CK. A reference clock signal RCLK serves as the basis of time axis. Herein, period of the 0th clock to 3rd clock of the reference clock signal RCLK is called a modulation cycle CIa, period of the 3rd clock to the 7th clock is a modulation cycle CIIa, and period of the 7th clock to the 13th clock is a modulation cycle CIIIa. The modulation cycles CIa to CIIIa constitute one unit cycle UT and the unit cycle UT is repeated.

The operation in the modulation cycle CIa will be described below. During period PP1a from the 0th clock to 1.5th clock of the reference clock signal RCLK, DP2="L", DN2="L", DP1="H", DN1="L", DP0="H" and DN0="L", and only the transistor TP20 is in its conductive state. Thereby, the amount of charge/discharge current CDI for charging the capacitor element C1 becomes +4i (it should be noted that the direction of current for charging the capacitor element C1 is positive herein). The voltage of the modulation signal VF increases with a gradient corresponding to this current amount. As the voltage of the modulation signal VF increases, the control signal VIN increases through the voltage adder circuit 16. Consequently, the frequency of the output signal CK increases with a gradient corresponding to the amount of charge/discharge current CDI for charging the capacitor element C1.

During period PP1b from the 1.5th clock to 3rd clock of the modulation cycle CIa, DP2="H" and DN2="H". The transistor TP20 transitions to its non-conductive state, whereas the transistor TN20 transitions to its conductive state. Thereby, the amount of charge/discharge current CDI for discharging the capacitor element C1 becomes −4i. Then, the voltage of the modulation signal VF decreases with a gradient corresponding to this current amount. As the voltage decreases, the control signal VIN decreases through the voltage adder circuit 16. Consequently, the frequency of the output signal CK decreases with a gradient corresponding to the amount of charge/discharge current CDI for discharging the capacitor element C1.

The operation in the modulation cycle CIIa will be explained below. During period PP2a from the 3rd clock to 5th clock of the reference clock signal RCLK, DP2="H", DN2="L", DP1="L", DN1="L", DP0="L", DN0="L", and the transistors TP10 and TP00 are in their conductive state. Thereby, the amount of charge/discharge current CDI for charging the capacitor element C1 becomes +3i. As described earlier, the frequency of the output signal CK increases with a gradient corresponding to the amount +3i of charge/discharge current CDI.

During period PP2b from the 5th clock to 7th clock of the modulation cycle CIIa, DP2="H", DN2="L", DP1="H", DN1="H", DP0="H", DN0="H", and the transistors TP10 and TP00 transitions to their non-conductive state, whereas the transistors TN10, TN00 transitions to their conductive state. Thereby, the amount of charge/discharge current CDI for discharging the capacitor element C1 becomes −3i. As described earlier, the frequency of the output signal CK decreases with a gradient corresponding to the amount −3i of charge/discharge current CDI.

The operation in the modulation cycle CIIIa will be described.

During period PP3a from the 7th clock to 10th clock of the reference clock signal RCLK, DP2="H", DN2="L", DP1="L", DN1="L", DP0="H", DN0="L", and the transistor TP10 is in its conductive state. Thereby, the amount of charge/discharge current CDI for charging the capacitor element C1 becomes +2i. The frequency of the output signal CK increases with a gradient corresponding to the amount +2i of charge/discharge current CDI.

During period PP3b from the 10th clock to 13th clock of the modulation cycle CIIIa, DP2="H", DN2="L", DP1="H", DN1="H", DP0="H", DN0="L", and the transistor TP10 transitions to the non-conductive state, whereas the transistors TN10 transitions to the conductive state. Thereby, the amount of charge/discharge current CDI for discharging the capacitor element C1 becomes −2i. Then, the frequency of the output signal CK decreases with a gradient corresponding to the amount −2i of charge/discharge current CDI. After the 13th clock, the unit frequency UT constituted by the modulation cycles CIa to CIIIa is repeated. The repetition of the unit cycle UT causes minute variations in the frequency of the output signal CK.

The charge amount and discharge amount in the modulation cycle CIa are equal to each other, described by 4i [A]×1.5 [clock]=6i [A·clock]. The charge amount and discharge amount in the modulation cycle CIIa are described by 3i [A]×2 [clock]=6i [A·clock]. The charge amount and discharge amount in the modulation cycle CIIIa are described by 2i [A]×3 [clock]=6i [A·clock]. As understood from this, the charge amounts and discharge amounts in all of the modulation cycles CIa to CIIIa are the same, i.e., 6i [A·clock]. Hence, the fluctuation range of the voltage of the modulation signal VF is a constant fluctuation range VFB throughout the modulation cycles CIa to CIIIa. Therefore, the fluctuation range of the frequency of the output signal CK is a constant fluctuation range CFB.

Figure 7:
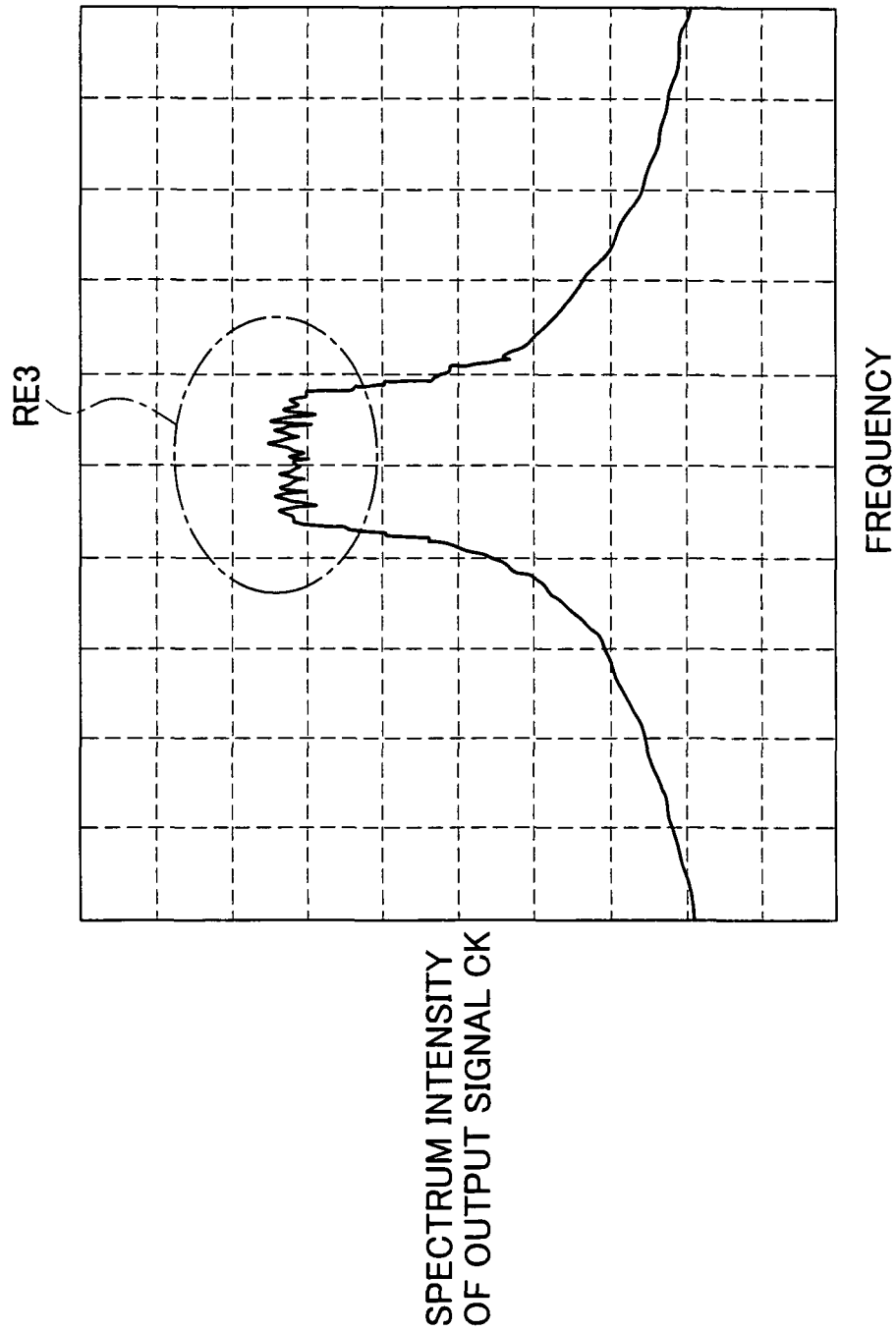
FIG. 7 is a spectrum waveform chart of the output signal CK from an SSCG circuit according to the second embodiment.

The effect of the use of the SSCG circuit according to the second embodiment will be described with reference to the spectrum waveform chart of FIG. 7. In the second embodiment, the modulation cycles CIa to CIIIa are repeated. Accordingly, the cycle for controlling the switching unit SSa changes to the plurality of different modulation cycles. As the modulation cycle varies to CIa, CIIa, CIIIa sequentially, the amount of charge/discharge current CDI is altered to 4i, 3i, 2i sequentially such that the charge/discharge amount of the capacitor element C1 becomes constant (i.e., 6i [A·clock] in this embodiment) throughout the modulation cycles. Since the charge/discharge amounts in all of the modulation cycles are the same, the fluctuation range of the frequency of the output signal CK becomes the constant fluctuation range CFB and, in consequence, the lengths of holding time for the oscillation frequencies in the fluctuation range become equal. Therefore, in the spectrum waveform after the spread spectrum modulation, peak values in the vicinity of the center of the frequency have a profile which is substantially flat as indicated by region RE3 of the spectrum waveform chart of FIG. 7. On the other hand, in the spectrum waveform of FIG. 4, spectrum values in the vicinity of the center of the frequency rise as indicated by region RE2, so that the profile of the top area is not flat. It is understood from this that the maximum value of spectrum intensity is made smaller in the second embodiment (FIG. 7), compared to the first embodiment (FIG. 4). With such a waveform, electromagnetic interference emission can be reduced so that malfunctions or the like due to a mutual interference between electronic devices can be prevented without fail.

Reference is made to the table of FIG. 8 to describe the correlation between the modulation cycles and the amount of charge/discharge current. The number of modulation cycles is determined by the number of bits of the digital code input from the switching control circuit 20a. Specifically, in the case of an output code having n bits (n=a natural number), (2n-1) types of modulation cycles are involved. In this embodiment, since an output code of 3 bits is explained, seven types of modulation cycles, i.e., modulation cycles MCI to MCVII are involved as shown in FIG. 8. Herein, the modulation cycle MCI is used as a basic cycle T0 which is the minimum cycle serving as a benchmark. Based on the basic cycle T0, the modulation cycle MCII is represented by 7/6×T0, the modulation cycle MCIII by 7/5×T0, . . . , and the modulation cycle MCVII by 7×T0.

For each of the modulation cycles MCI to MCVII, charge/discharge current is determined. Concretely, charge/discharge current is so determined that the charge amount obtained from the product of charge/discharge current and cycles takes a constant value throughout the modulation cycles MCI to MCVII. Referring to FIG. 8, in the modulation cycle MCI, signals DP0, DP1, DP2, DN0, DN1, DN2 are all selected and a current having an amount of $7i$ (the maximum current) flows. Likewise, $6i$ flows in the modulation cycle MCII, $5i$ flows in the modulation cycle MCIII, and so on. In the modulation cycle MCVII, a current having an amount of $1i$ (the minimum current) flows. This allows the charge/discharge amounts for the capacitor element C1 in all of the modulation cycles to be the same, being equal to the basic charge amount $7i×T0$ [A·s]. For each of the modulation cycles CIa to CIIIa described earlier, a cycle selected from the modulation cycles MCI to MCVII and the current value corresponding to the selected modulation cycle are used in combination, thereby making the charge/discharge amounts for all the modulation cycles equal.

As fully discussed in the above description, the SSCG circuit of the second embodiment is formed such that by changing charge/discharge current according to the modulation cycles, the charge/discharge amounts for all the modulation cycles can be made equal. Therefore, the fluctuation range of the frequency of the output signal from the voltage control oscillator becomes constant in all of the modulation cycles. This makes the lengths of holding time for the oscillation frequencies within the fluctuation range even. Since the spectrum waveform after the spread spectrum modulation has a flat peak profile, the maximum value of spectrum intensity can be made smaller. In consequence, electromagnetic interference emission can be reduced and, therefore, malfunctions or the like due to the mutual interference between electronic devices can be prevented without fail.

It is apparent from the above discussion that the invention is not necessarily limited to the particular embodiments shown herein and various changes and modifications are made to the disclosed embodiments without departing from the spirit and scope of the invention. In FIG. 6 associated with the second embodiment, the reference clock signal RCLK is used as the basis of time axis. It is obviously possible to use the basic clock signal CLK in place of the reference clock signal RCLK.

Although the first embodiment has been discussed with the unit cycle UT which is composed of three modulation cycles (the modulation cycles CI to CIII), the invention is not limited to this. The more the types of modulation cycles are included in the unit cycle UT, the smaller the maximum value of spectrum intensity after the spread spectrum modulation becomes. Therefore, it is more preferable to use many types of modulation cycles. In addition, a modulation cycle is not necessarily changed to another for every cycle. It is, however, more desirable in view of reducing the maximum value of spectrum intensity that the modulation cycle is changed to CI, CII and CIII for every cycle as shown in FIG. 3, because it enhances spread spectrum.

Although the second embodiment has been discussed with a case where the number of bits of the digital code output from the switching control circuit 20a is three, it is apparent that the invention is not limited to this but applicable to cases where the number of bits is more than three. An increasing number of bits enables spread spectrum in broader cycles and is therefore preferred in view of reducing the maximum value of spectrum intensity. In this case, it is necessary to increase the number of transistors which constitute the charger unit CGa and the discharger unit DGa in accordance with the increasing number of bits of the digital code.

While the charger unit CGa and the discharger unit DGa are formed such that current supply capacity is weighted by the power of 2 in the second embodiment (FIG. 5), the invention is not limited to this. Current supply capacity may be independently determined for each modulation cycle such that the charge/discharge amounts for all the modulation cycles are the same. For instance, in a case where the modulation cycle is varied to T0, 2×T0 and 3×T0, the sizes of the transistors may be properly set such that the current supply capacities of the charger unit CG and discharger unit DG are set to $3i$, $1.5i$ and $1i$, respectively, in correspondence with the modulation cycles. Then, the charger and discharger units which provide a current amount of $3i$ are selected when the modulation cycle is T0, the charger and discharger units which provide a current amount of $1.5i$ are selected when the modulation cycle is 2×T0, and the charger and discharger units which provide a current amount of $1i$ are selected when the modulation cycle is 3×T0, whereby the charge/discharge amounts for all the modulation cycles become equal.

While the foregoing embodiments have been described with the charger unit CG (CGa) and discharger unit DG (DGa) which are a constant current source, the invention is not limited to this. Additionally, the current supply capacity of the charger unit and discharger unit may be weighted by the power of 2 by use of a resistor element.

It should be noted that the charger units CG and CGa are examples of the fist charger unit, the discharger units DG and DGa are examples of the second charger unit, and the switching control circuit 20a is one example of the digital control circuit.

According to the invention, since voltage level does not discontinuously abruptly change and therefore smooth switching of voltage level can be achieved, spread spectrum having less jitter becomes possible so that electromagnetic interference emission can be reduced. In addition, a reduction in circuit scale and power saving can be accomplished.

What is claimed is:

1. A spread spectrum clock generation circuit comprising:
   a voltage control oscillator circuit;
   a voltage adder to add a first voltage for controlling a frequency of an output signal from the voltage control oscillator circuit so as to have a specified value to a second voltage for modulating the frequency and to output a sum of the first voltage and the second voltage to the voltage control oscillator circuit;
   a capacitor unit to output the second voltage for modulating the frequency from a second terminal thereof while a given voltage is applied to a first terminal thereof;
   a first charger unit coupled between the second terminal of the capacitor unit and a power supply line to charge the capacitor unit by a constant current based on a voltage of the power supply line;
   a second charger unit coupled to the second terminal of the capacitor unit to discharge the capacitor unit; and
   a switching unit to alternately make a first connection between the first charger unit and the capacitor unit and a second connection between the second charger unit and the capacitor unit in each of a plurality of different cycles to which a modulation cycle varies,
   wherein the first charger unit is substantially equivalent to the second charger unit in current supply capacity
   a digital control circuit provided for generating an output code of n bits (n=a natural number) according to the modulation cycle;
   a plurality of the first charger units are provided which have current supply capacities weighted by a power of 2;
   a plurality of the second charger units are provided, each having the same current supply capacity as a current supply capacity of the first charger unit associated with the each of the pluraliry of the second charger units; and
   wherein the switching unit is provided for each of the plurality of first charger units and the plurality of second charger units and the switching units are controlled according to the output code.

2. The spread spectrum clock generation circuit according to claim 1,
   wherein the charge amount and discharge amount of the capacitor unit in each cycle of the modulation cycle are substantially equal.

3. The spread spectrum clock generation circuit according to claim 1,
   wherein the switching unit alternately makes the first connection and the second connection at a time ratio of 1:1 in each cycle of the modulation cycle.

4. The spread spectrum clock generation circuit according to claim 1,
   wherein the modulation cycle varies for every time cycle.

5. The spread spectrum clock generation circuit according to claim 1,
   wherein the first charger unit and the second charger unit are a constant current source.

6. The spread spectrum clock generation circuit according to claim 1,
   wherein a plurality of the first charger units are provided which have different current supply capacities,
   wherein a plurality of the second charger units are provided, each having the same current supply capacity as that of its associated first charger unit, and
   wherein the switching unit is provided for each of the first charger units and second charger units and the switching units are controlled according to the modulation cycle such that the charge and discharge amount of the capacitor unit becomes constant.

7. The spread spectrum clock generation circuit according to claim 1,
   wherein the output code is generated such that the charge and discharge amount of the capacitor unit becomes constant.

8. The spread spectrum clock generation circuit according to claim 1,
   wherein the first charger unit charges the capacitor unit by the constant current, and the second charger unit discharges the capacitor unit by the constant current.

9. A method of controlling a spread spectrum clock generation circuit, comprising:
   alternately charging and discharging a capacitor unit so that a given voltage is applied to a first terminal thereof, via a second terminal thereof, in each of a plurality of different cycles to which a modulation cycle is varied;
   outputting a voltage value according to an amount of charge accumulated in the capacitor unit;
   outputting a signal indicative of oscillation frequency modulated according to the voltage value according to the amount of charge; and
   generating an output code of n bits (n=a natural number) according to the modulation cycle,
   wherein the alternately charging and discharging the capacitor unit is carried out by alternately making a first connection between a power supply line and the capacitor unit via a first charger unit for charging the capacitor unit by a constant current based on a voltage of the power supply line and a second connection between a second charger unit for discharging the capacitor unit and the capacitor unit, and an amount of charge current in the charging is substantially equivalent to an amount of discharge current in the discharging; and
   wherein the alternately charging and discharging the capacitor unit is performed such that the amount of charge and discharge current is enabled to be switched to (2n−1) stages and charging and discharging is carried out after selecting the amount of charge and discharge current according to the modulation cycle.

10. The method of controlling a spread spectrum clock generation circuit according to claim 9,
    wherein the alternately charging and discharging the capacitor unit is performed such that the amount of charge and discharge current for the capacitor unit is controlled according to the modulation cycle such that the charge and discharge amounts of the capacitor unit in all cycles of the modulation cycle are the same.

11. The method of controlling a spread spectrum clock generation circuit according to claim 9,
    wherein the charging the capacitor unit is conducted by the constant current and the discharging the capacitor unit is conducted by the constant current.

12. A spread spectrum clock generator circuit comprising:
    a voltage control oscillator;
    a voltage adder which adds a first voltage for controlling a frequency of an output signal from the voltage control oscillator so as to have a specified value to a second voltage for modulating the frequency and outputs a sum of the first voltage and the second voltage to the voltage control oscillator;

a capacitor which outputs the second voltage for modulating the frequency from a second terminal thereof while a given voltage is applied to a first terminal thereof;

a charger which is coupled between the second terminal of the capacitor and a power supply line to charge the capacitor by a constant current based on a voltage of the power supply line;

a discharger which is coupled to the second terminal of the capacitor to discharge the capacitor; and a switch which alternatively switches a first state and a second state in each of a plurality of different cycles to which a modulation cycle varies, wherein the charger is coupled to the capacitor and the discharger is decoupled to the capacitor in the first state, the charger is decoupled to the capacitor and the discharger is coupled to the capacitor in the second state;

a digital control circuit provided for generating an output code of n bits (n=a natural number) according to the modulation cycle;

a plurality of the chargers are provided which have current supply capacities weighted by a power of 2;

a plurality of the dischargers are provided, each having the same current supply capacity as that of the charger associated with the each of the plurality of the dischargers; and wherein the switch is provided for each of the plurality of chargers and the plurality of dischargers and the switches are controlled according to the output code.

13. The spectrum clock generator circuit according to claim 12, wherein a current driving capacity of the charger is substantially equivalent to a current driving capacity of the discharger.

14. The spread spectrum clock generator circuit according to claim 12, wherein the charger charges the capacitor by the constant current, and the discharger discharges the capacitor by the constant current.

* * * * *